United States Patent
Tung

(10) Patent No.: US 6,180,539 B1
(45) Date of Patent: Jan. 30, 2001

(54) METHOD OF FORMING AN INTER-POLY OXIDE LAYER

(75) Inventor: Ming-Tsung Tung, Hsinchu Hsien (TW)

(73) Assignee: United Microelectronics Corp., Hsinchu (TW)

(*) Notice: Under 35 U.S.C. 154(b), the term of this patent shall be extended for 0 days.

(21) Appl. No.: 09/207,110

(22) Filed: Dec. 8, 1998

(51) Int. Cl.⁷ .................................................. H01L 20/336
(52) U.S. Cl. .......................... 438/770; 438/257; 438/593; 438/250; 438/253; 438/393; 438/396
(58) Field of Search .................................. 257/347, 382, 257/776, 784; 438/528, 510, 257, 281, 151, 585, 593, 594, 607, 657, 770, 771, 772, 773, 774

(56) References Cited

U.S. PATENT DOCUMENTS

| | | | |
|---|---|---|---|
| 4,693,759 | * 9/1987 | Noguchi et al. | 437/24 |
| 4,992,846 | * 2/1991 | Sakakibari et al. | 357/59 |
| 5,077,226 | * 12/1991 | Youn et al. | 437/31 |
| 5,191,397 | * 3/1993 | Yoshida | 257/347 |
| 5,395,804 | * 3/1995 | Ueda | 437/233 |
| 5,502,315 | * 3/1996 | Chua et al. | 257/50 |
| 5,600,154 | * 2/1997 | Shimizu | 257/66 |
| 5,880,498 | * 3/1999 | Kinoshita et al. | 257/315 |
| 6,010,952 | * 1/2000 | Tsai et al. | 438/528 |
| 6,020,237 | * 2/2000 | Shrivastava et al. | 438/257 |

* cited by examiner

Primary Examiner—Mary Wilczewski
Assistant Examiner—David Goodwin
(74) Attorney, Agent, or Firm—Oblon, Spivak, McClelland, Maier & Neustadt, P.C.

(57) ABSTRACT

A method of forming an inter-poly oxide layer is provided. A substrate having a field oxide layer thereon is provided. A first polysilicon layer is formed on the field oxide layer. The surface of the first polysilicon layer is destroyed by heavy ions to form an amorphous silicon surface. The amorphous silicon surface converts to an epitaxial silicon film by annealing. The epitaxial silicon film and the remaining first polysilicon layer are defined to form a bottom electrode of a capacitor. An oxide layer is formed as a dielectric layer of the capacitor by oxidizing the epitaxial silicon layer. At the same time, a gate oxide layer is formed on the exposed substrate.

18 Claims, 4 Drawing Sheets

METHOD OF FORMING AN INTER-POLY OXIDE LAYER

BACKGROUND OF THE INVENTION

1. Field of the Invention

The invention relates in general to a method of forming semiconductor integrated circuits (ICs), and more particularly to a method of forming an inter-poly oxide layer.

2. Description of the Related Art

A conventional fabrication process of mixed mode devices comprises forming a pad oxide layer and a silicon nitride layer on a provided substrate. Active regions for forming transistors are defined on the substrate. A part of the silicon nitride layer and a part of the pad oxide layer are removed to form a field oxide layer to isolate the active regions from each other. A first polysilicon layer is formed on the active regions and the field oxide layer. A part of the first polysilicon layer is removed to form a lower electrode positioned over the field oxide layer using a photoresist layer. The silicon nitride layer and the pad oxide layer positioned on the active regions are removed. A gate oxide layer is formed on the active regions by thermal oxidation. At the same time, an oxide layer is formed on the profile of the lower electrode. A conformal second polysilicon layer is formed on the substrate. A silicide layer is formed on the second polysilicon layer. A part of the silicide layer and a part of the second polysilicon layer are removed to form a gate of a transistor and an upper electrode. The gate is formed on the gate oxide layer. The lower electrode, the oxide layer and the upper electrode constitute a capacitor on the field oxide layer.

FIG. 1 is a schematic. cross-sectional view showing a conventional, mixed mode device comprising a capacitor and a transistor. A gate 111 is formed on a gate oxide layer 105. A capacitor 101 is formed on a field oxide layer 103. The capacitor 101 consists of a polysilicon layer as a bottom electrode 107, another polysilicon layer as a top electrode 109 and a dielectric layer 113, such as a silicon oxide layer, between the top electrode 109 and the bottom electrode 107. The dielectric layer 113 is called inter-poly oxide layer 113.

FIGS. 2A to 2E are schematic, cross-sectional views showing a conventional process for forming a mixed mode device. In FIG. 2A, a substrate 201 is provided. A field oxide layer 203 is formed on the substrate 201 to isolate an active region 201a. A gate oxide layer 205 is formed on the active region 201a, for example, by thermal oxidation.

In FIG. 2B, a polysilicon layer 207 is formed over the substrate 201 to cover the gate oxide layer 205 and the field oxide layer 203.

In FIG. 2C, the polysilicon layer 207 is defined to form a gate 207b on the gate oxide layer 205 and to form a bottom electrode 207a of a capacitor on the field oxide layer 203.

In FIG. 2D, an inter-poly oxide layer 209a is formed on the bottom electrode 207a. At the same time, an oxide layer 209b is formed on the gate 207b so that the oxide layer 209b and the inter-poly oxide layer 209a have the same thick. Since the inter-poly oxide layer 209a is used as a dielectric layer of the capacitor, the thickness and the uniformity of the inter-poly oxide layer 209a do affect the capacitor quality.

In FIG. 2E, a top electrode 211, such as a polysilicon layer, is formed on the inter-poly oxide layer 209a to complete the capacitor of the mixed mode device.

According to the description the conventional method performs two oxidation steps to form the gate oxide layer 205 and to form the inter-poly oxide layer 209a. These steps require a long reacting time (silicon oxide with 1000 Å requires about 2–8 hours to react). Furthermore a silicon oxide layer formed on a polysilicon layer is too non-uniform to be the dielectric layer of a capacitor so that capacitance of the capacitor is increased only with difficulty.

SUMMARY OF THE INVENTION

It is therefore an object of the invention to provide a method of forming an inter-poly oxide layer to obtain a better uniformity of the inter-poly oxide layer than a conventional inter-poly oxide layer. The inter-poly oxide layer is applied to form a capacitor of a DRAM, an EPROM, an E²PROM or a mixed mode device.

It is another object of the invention to provide a method to decrease oxidation rate by doping an impurity into an epitaxial silicon layer to form a thin oxide layer. According the invention, a oxidation step is skipped to save the reaction time for forming the oxide layer.

The invention achieves the above-identified objects by providing a method of forming an inter-poly oxide layer. A substrate having a field oxide layer thereon is provided. A first polysilicon layer is formed on the field oxide layer. The surface of the first polysilicon layer is destroyed by heavy ions to form an amorphous silicon surface. The amorphous silicon surface converts to an epitaxial silicon film by annealing. The epitaxial silicon film and the remaining first polysilicon layer are defined to form a bottom electrode of a capacitor. An oxide layer as a dielectric layer of the capacitor is formed by oxidizing the epitaxial silicon layer. At the same time, a gate oxide layer is formed on the exposed substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
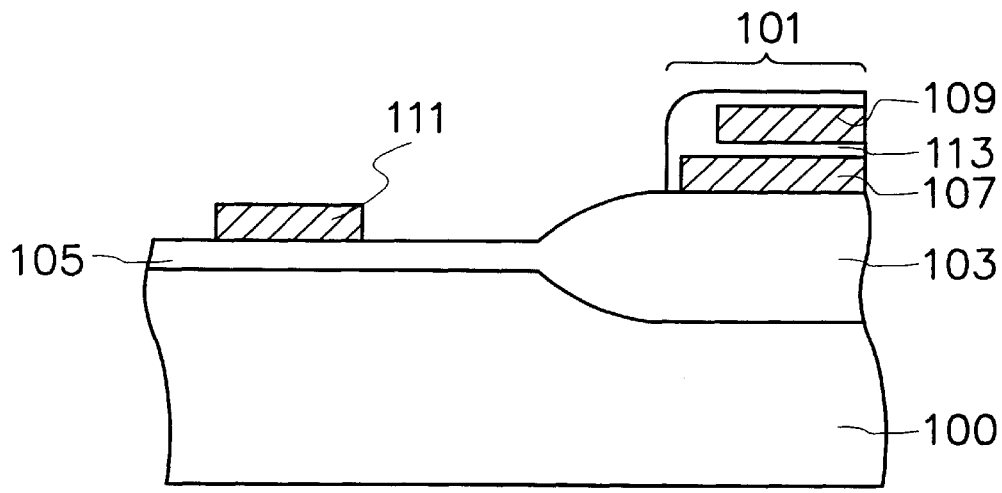
FIG. 1 is a schematic, cross-sectional view showing a conventional mixed mode device comprising a capacitor and transistor.
Figure 2A:
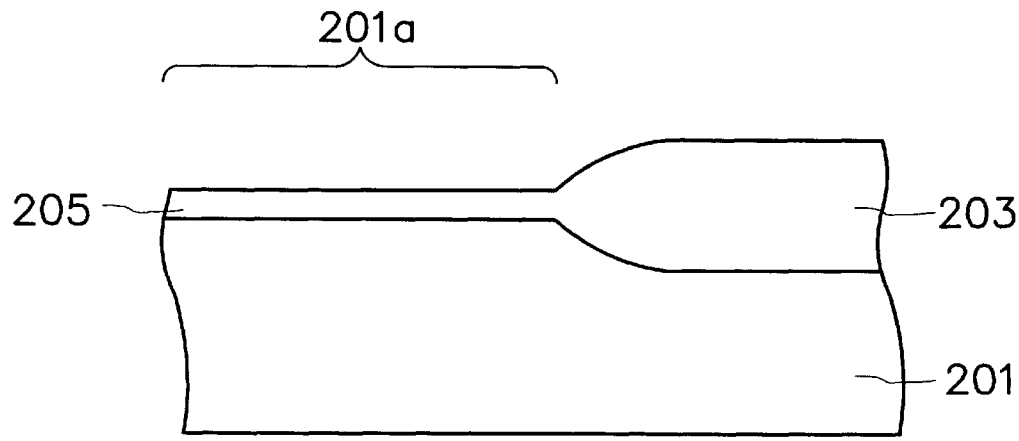
FIGS. 2A to 2E are schematic, cross-sectional views showing a conventional process for forming a mixed mode device.
Figure 2B:
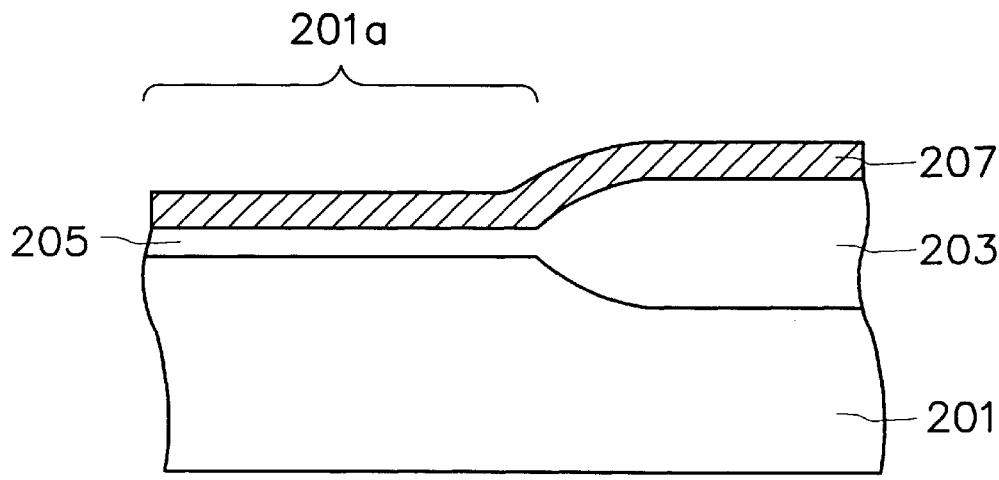
Figure 2C:
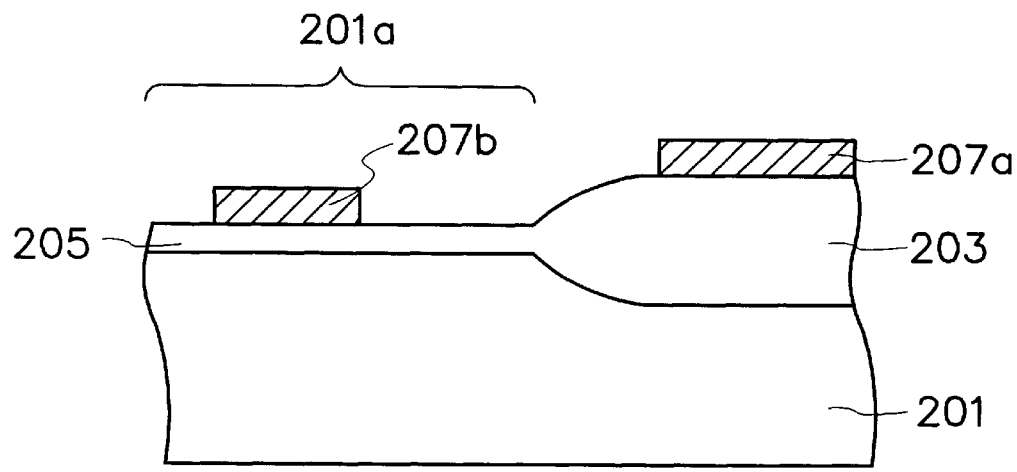
Figure 2D:
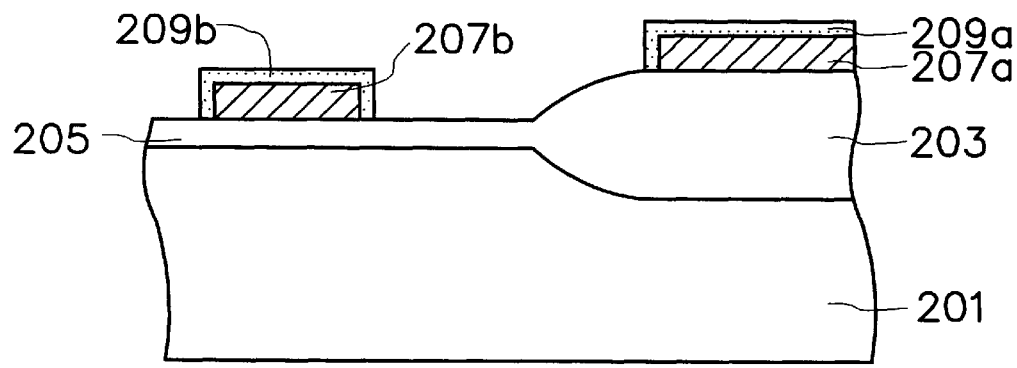
Figure 2E:
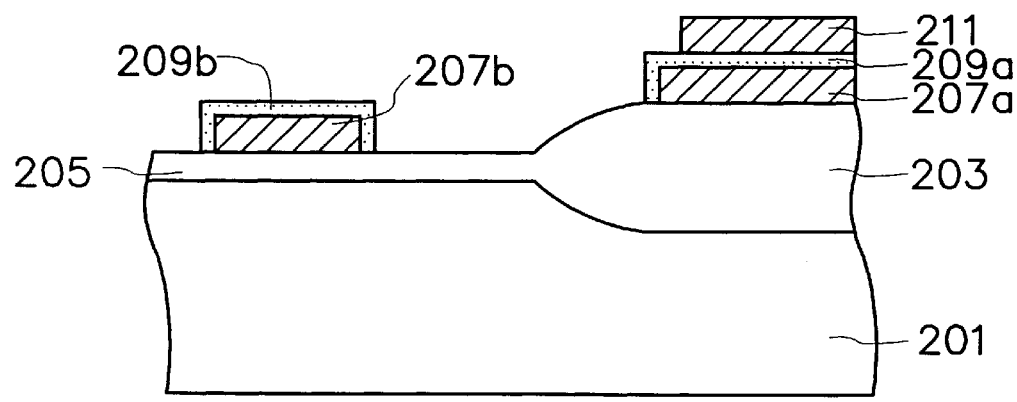
Figure 3A:
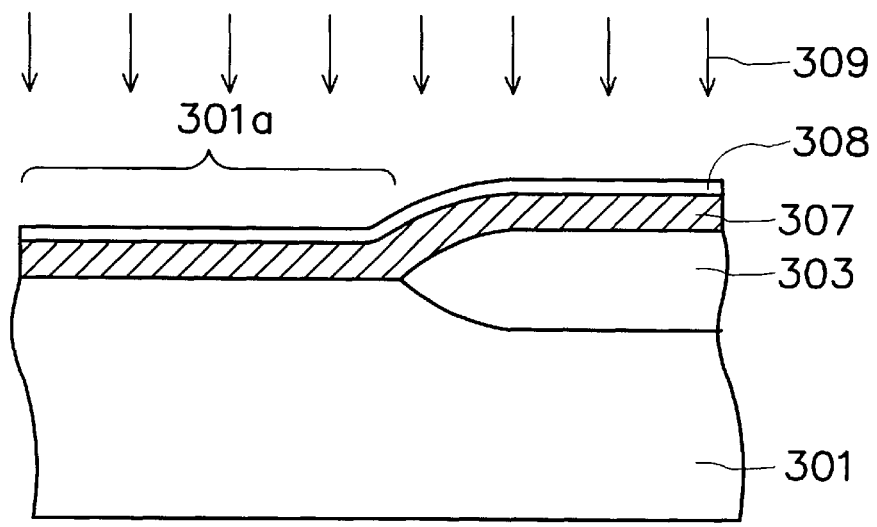
FIGS. 3A to 3F are schematic, cross-sectional views showing steps of one preferred embodiment of the method of forming an inter-poly oxide layer.

In FIG. 3A, a substrate 301 is provided. A field oxide layer 303 is formed on the substrate 301 to isolate an active region 301a of the substrate 301. A first polysilicon layer 307 is formed on the substrate 301 and the field oxide layer 303. The preferred method to form the first polysilicon layer comprises low-pressure chemical vapor deposition (LPCVD) using $SiH_4$ as a source. The surface of the first polysilicon layer 307 is treated to form an epitaixial film 308. A preferred method to form the epitaxial film 308 comprises the following, steps. Plasma 309 with heavy ions is applied at the surface of the first polysilicon layer 307 about 5–100 seconds to form an amorphous layer thereon. For example, the plasma comprises argon ion with a flowing rate of about 100–2000 sccm and with a power of about 50–1000 Watts. The amorphous layer is converted to the epitaxial film 308 by annealing. The annealing is performed, for example, by furnace or rapid thermal oxidation under about 800–1000° C.

Figure 3B:
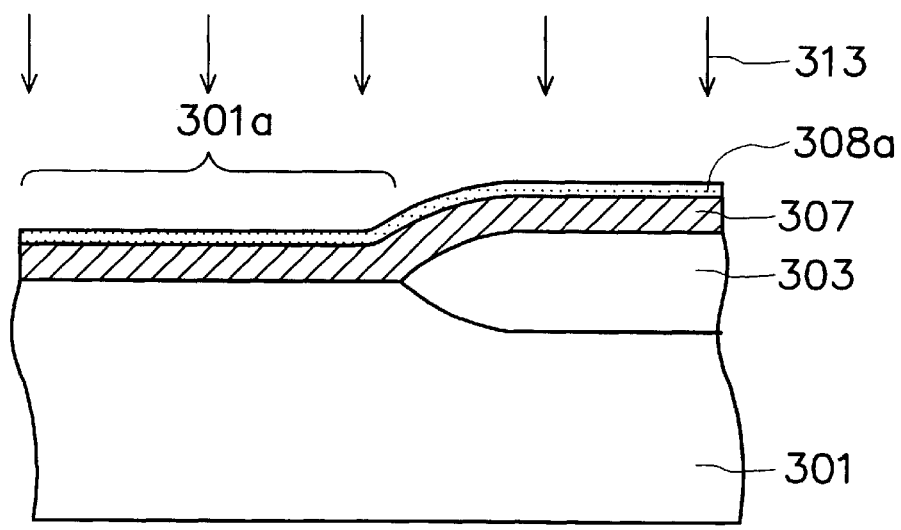

In FIG. 3B, impurity, such as nitrogen, is doped into the epitaxial film 308 to form a doped epitaxial film 308a. A preferred method of doping the impurity is ion implantation. The oxidizing rate of silicon is reduced for doping the impurity.

Figure 3C:
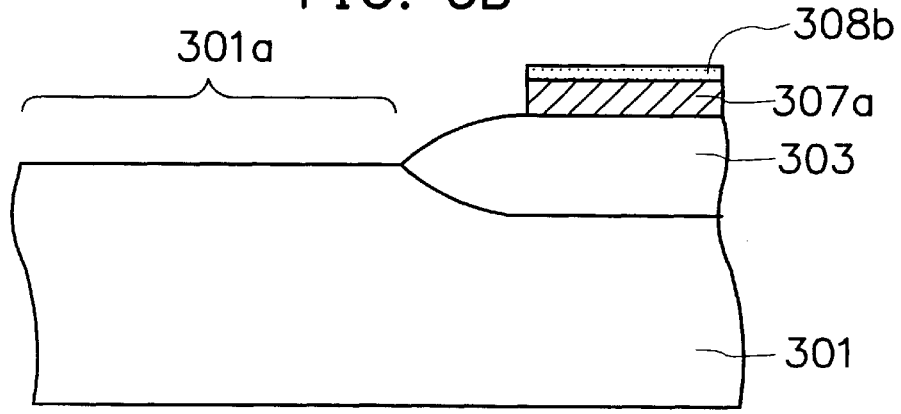

In FIG. 3C, the first polysilicon layer 307 and the doped epitaxial film 308a are defined, for example, using a photolithography and etching process. A part of the first polysilicon layer 307a used as a bottom electrode and a part of the epitaxial film 308b remain on the field oxide layer 303.

Figure 3D:
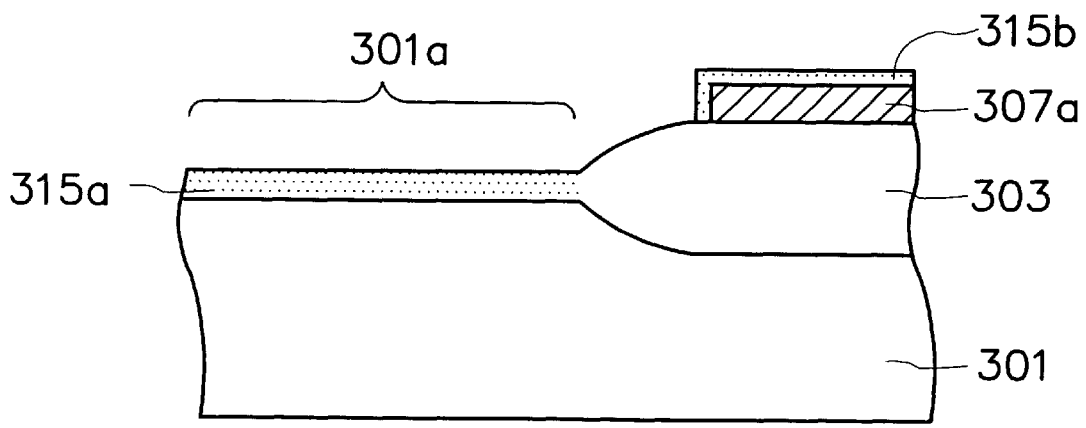

In FIG. 3D, the remaining epitaxial film 308b is oxidized, for example, by thermal oxidation to form an inter-poly oxide layer 315b as a dielectric layer of a capacitor on the bottom electrode 307a. In the same oxidation step, a gate oxide layer 315a is formed on the substrate positioned on the active region 301a. Since the doping epitaxial film 308b and the substrate 301 are different, the oxidation rates of the doping epitaxial film 308b and of the substrate 301 are different. The inter-poly oxide layer 315b is thus thinner than the gate oxide layer 315a. Furthermore, the inter-poly oxide layer 315b is formed from the doping epitaxial film 308b so that the inter-poly oxide layer is uniform.

Figure 3E:
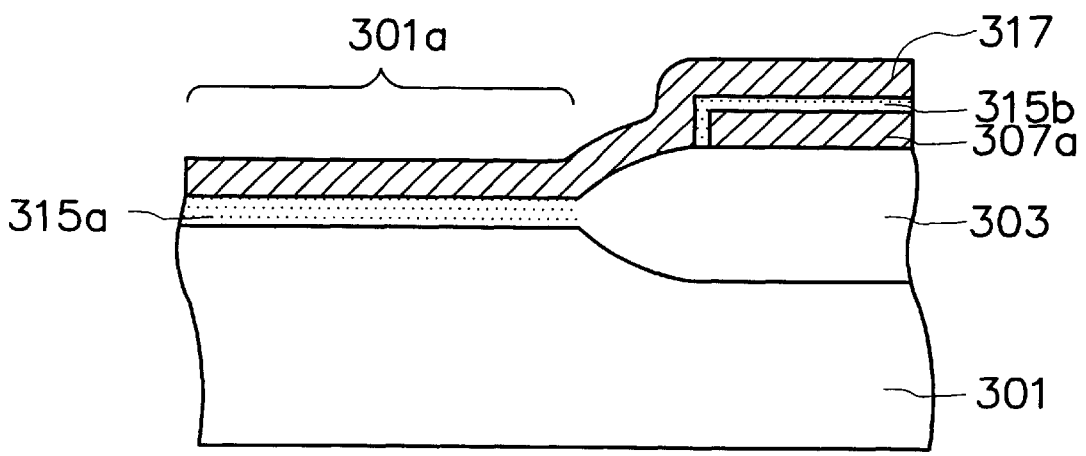

In FIG. 3E, a second polysilicon layer 317 is formed, for example, by chemical vapor deposition (CVD) on the structure shown in FIG. 3D to cover the gate oxide layer 315a and the inter-poly oxide layer 315b.

Figure 3F:
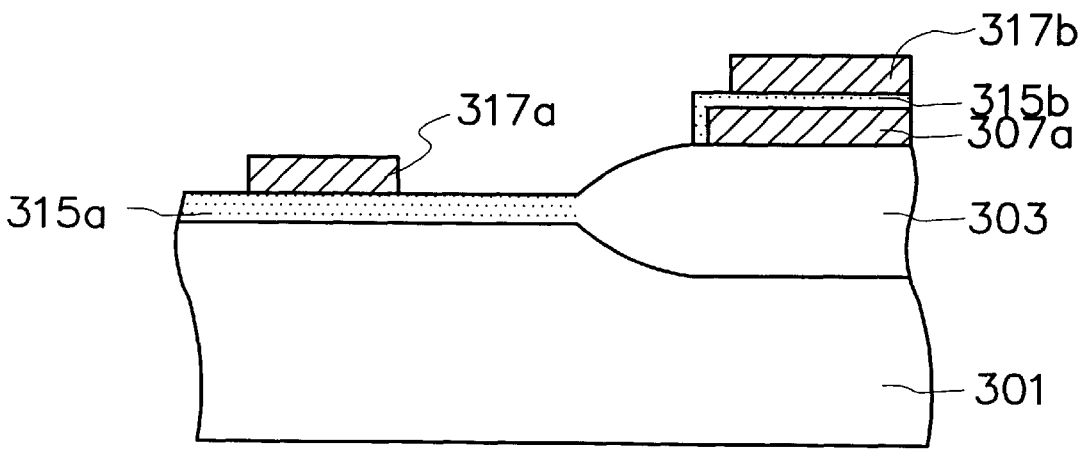

In FIG. 3F, the second polysilicon layer 317 is defined to form a gate 317a on the gate oxide layer 315a and to form a top electrode 317b on the inter-poly oxide layer 315b. A transistor gate and a capacitor are thus formed. The transistor and the capacitor together make a mixed mode device.

A gate structure of a flash memory, an EPROM or an $EP^2ROM$ comprises a floating gate a control gate and a dielectric layer between the floating gate and the control gate. The gate structure is similar in structure to the capacitor of the mixed mode devices. A capacitor in a memory cell of a DRAM is similar in structure to the capacitor of the mixed mode device, too. The invention thus provides a method which applies to forming DRAMs, flash memories, EPROMs and $E^2PROMs$.

A feature of the invention is the performance of an ion implantation step and an annealing step on the surface of a polysilicon layer to form an epitaxial film. The epitaxial film is oxidized to form a thin and uniform oxide layer. The oxide layer is used as a dielectric layer of a capacitor to enhance the capacitance of the capacitor.

Another feature of the invention is that the oxide layer is thinner than the gate oxide layer from doping impurity into the epitaxial film. The thickness of the oxide layer is controlled by a concentration of the impurity in the epitaxial film.

Yet another feature of the invention is that the gate oxide layer and the oxide layer are formed at the same time so that an oxidation step is saved. Process time is thus reduced to enhance the performance of forming a mixed mode device.

Yet another feature of the invention is that the method applies to form oxide layers with high quality of DRAMs, of flash memories, of EPROMs or of $E^2PROMs$.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming an inter-poly oxide layer, comprising the steps of:
   providing a substrate, wherein the substrate has a field oxide layer thereon;
   forming a first polysilicon layer on the substrate and on the field oxide layer;
   forming a doped epitaxial film on the first polysilicon layer;
   patterning the epitaxial film and the first polysilicon layer to form a bottom electrode on the field oxide layer;
   oxidizing the epitaxial film to form the inter-polyoxide layer on the bottom electrode and to form a gate oxide layer on the substrate;
   forming a second polysilicon layer on the inter-poly oxide layer and on the gate oxide layer; and
   patterning the second polysilicon layer to form a gate on the gate oxide layer and to form a top electrode on the inter-poly oxide layer.

2. The method according to claim 1, wherein the step of forming a doped epitaxial film on the first polysilicon layer further comprises steps of:
   treating the surface of the first polysilicon layer with plasma to form an amorphous layer;
   annealing the amorphous layer to form the epitaxial film; and
   doping an impurity into the epitaxial film.

3. The method according to claim 2, wherein the plasma comprises argon.

4. The method according to claim 2, wherein the step of doping an impurity into the epitaxial film is performed by ion implantation.

5. The method according to claim 2, wherein the impurity comprises nitrogen.

6. The method according to claim 1, wherein the gate oxide layer and the inter-poly oxide layer are formed by thermal oxidation.

7. A method of forming a dielectric layer of a capacitor, comprising steps of:
   providing a substrate;
   forming a first polysilicon layer on the substrate;
   forming a doped epitaxial film on the first polysilicon layer; patterning the first polysilicon layer and the epitaxial film to form a bottom electrode on the substrate;
   entirely oxidizing the epitaxial film to form the dielectric layer on the bottom electrode; and
   forming a top electrode on the dielectric layer.

8. The method according to claim 7, wherein the step of forming a doped epitaxial film on the first polysilicon layer further comprises steps of:
   treating the surface of the first polysilicon layer by plasma to form an amorphous layer;
   annealing the amorphous layer to form the epitaxial film; and
   doping an impurity into the epitaxial film.

9. The method according to claim 8, wherein the plasma comprises argon.

10. The method according to claim 8, wherein the step of doping impurity into the epitaxial film is performed by ion implantation.

11. The method according to claim 8, wherein the impurity comprises nitrogen.

12. The method according to claim 7, wherein the dielectric layer is formed by thermal oxidation.

13. A method of forming a oxide layer, comprising steps of:

provide a substrate;

forming a polysilicon layer on the substrate;

forming a doped epitaxial film on the polysilicon layer; and entirely oxidizing the doped epitaxial film to form an oxide layer on the polysilicon layer.

14. The method according to claim 13, wherein the step of forming the doped epitaxial film on the polysilicon layer further comprises steps of:

treating the surface of the polysilicon layer by plasma to form an amorphous layer;

annealing the amorphous layer to form the epitaxial film; and doping an impurity into the epitaxial film.

15. The method according to claim 14, wherein the plasma comprises argon.

16. The method according to claim 14, wherein the step of doping an impurity into the epitaxial film is performed by ion implantation.

17. The method according to claim 14, wherein the impurity comprises nitrogen.

18. The method according to claim 13, wherein the oxide layer is formed by thermal oxidation.

* * * * *